(12) United States Patent
Codding et al.

(10) Patent No.: US 7,732,303 B2
(45) Date of Patent: Jun. 8, 2010

(54) METHOD FOR RECYCLING OF ION IMPLANTATION MONITOR WAFERS

(75) Inventors: Steven Ross Codding, Underhill Center, VT (US); Joseph R. Greco, South Burlington, VT (US); Timothy Charles Krywanczyk, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/023,224

(22) Filed: Jan. 31, 2008

(65) Prior Publication Data

US 2009/0197400 A1 Aug. 6, 2009

(51) Int. Cl.
*H01L 21/322* (2006.01)

(52) U.S. Cl. .......... 438/473; 438/58; 438/143; 257/E21.214; 257/E21.38; 257/E21.237

(58) Field of Classification Search .......... 438/58, 438/143, 310, 402, 456–459, 471, 473, 477; 257/E21.214, E21.237, E21.318, E29.106
See application file for complete search history.

(56) References Cited

U.S. PATENT DOCUMENTS

| 5,759,909 | A   | * | 6/1998 | Goebel et al. ............. 438/558 |
| 6,568,794 | B2  | * | 5/2003 | Yamanaka et al. .......... 347/54 |
| 6,752,694 | B2  |   | 6/2004 | Schneegans et al. |
| 6,917,433 | B2  |   | 7/2005 | Levy et al. |
| 7,037,854 | B2  |   | 5/2006 | Bachrach et al. |
| 2007/0063217 | A1 | * | 3/2007 | Brogan et al. ............ 257/133 |
| 2008/0185715 | A1 | * | 8/2008 | Kroninger et al. ......... 257/730 |

FOREIGN PATENT DOCUMENTS

JP       9237771 A    9/1997

* cited by examiner

*Primary Examiner*—W. David Coleman
*Assistant Examiner*—Su C Kim
(74) *Attorney, Agent, or Firm*—Schmeiser, Olsen & Watts; Riyon W. Harding

(57) ABSTRACT

A method of recycling monitor wafers. The method includes: (a) providing a semiconductor wafer which includes a dopant layer extending from a top surface of the wafer into the wafer a distance less than a thickness of the wafer, the dopant layer containing dopant species; after (a), (b) attaching an adhesive tape to a bottom surface of the wafer; after (b), (c) removing the dopant layer; and after (c), (d) removing the adhesive tape.

25 Claims, 4 Drawing Sheets

METHOD FOR RECYCLING OF ION IMPLANTATION MONITOR WAFERS

FIELD OF THE INVENTION

The present invention relates generally to semiconductor processing and more particularly to recycling of ion implantation monitor wafers.

BACKGROUND OF THE INVENTION

Ion implantation monitor wafers are used to monitor ion implantation tools. More specifically, a monitor wafer is placed in an ion implantation tool and the ion implantation process is performed on the monitor wafer. Then, the monitor wafer is taken out of the ion implantation tool and the doping dose on the monitor wafer is measured to determine if the ion implantation process is within specification. Since ion implantation monitor wafers are expensive, there is a need for a method for recycling ion implantation monitor wafers.

SUMMARY OF THE INVENTION

A first aspect of the present invention is a method, comprising: (a) providing a semiconductor wafer which includes a dopant layer extending from a top surface of the wafer into the wafer a distance less than a thickness of the wafer, the dopant layer containing dopant species; after (a), (b) attaching an adhesive tape to a bottom surface of the wafer; after (b), (c) removing the dopant layer; and after (c), (d) removing the adhesive tape.

A second aspect of the present invention is a method, comprising: (a) providing a semiconductor wafer; (b) forming a dopant layer in the wafer, the dopant layer extending from a top surface of the wafer into the wafer a distance less than a thickness of the wafer, the dopant layer containing dopant species; after (b), (c) attaching an adhesive tape to a bottom surface of the wafer; after (c), (d) removing the dopant layer; and after (d), (e) removing the adhesive tape; and after (e), (f) repeating steps (b) through (e) a predetermined number of times.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Most semiconductor substrates are thin, flat and circular in shape (i.e., disk-shaped). Such substrates are often called wafers. During fabrication of integrated circuits, multiple integrated circuits are fabricated on the same substrate and then singulated (e.g., diced) into individual integrated circuit chips. Accordingly, integrated circuit fabrication tool such as ion implanters are designed to process whole wafer and uniformly implant dopant species into the entire surface region of the wafer. Thus the term wafer is defined as thin circular semiconductor substrate.

Figure 1A:
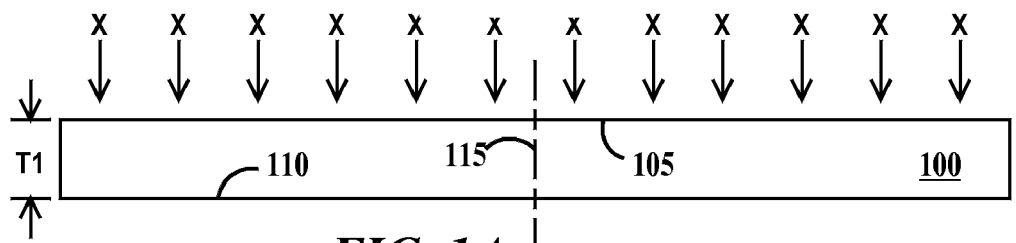
FIG. 1A is a cross-section view of an ion implantation monitor wafer being ion implanted in accordance with embodiments of the present invention.

FIG. 1A is a cross-section view of an ion implantation monitor wafer being ion implanted in accordance with embodiments of the present invention. In FIG. 1A, a monitor wafer 100 has a top surface 105 and a bottom surface 110 and a central axis 115 about which the wafer is symmetrical. In one example, monitor wafer 100 is a blank wafer containing no other layers, electrical devices, or structures. Monitor wafer 100 has an initial thickness (as fabricated thickness) of T1. In one example, monitor wafer 100 has an initial T1 thickness of about 725 microns and a diameter of 200 mm. In one example, monitor wafer 100 has an initial T1 thickness of about 775 microns and a diameter of 300 mm. In one example, monitor wafer 100 comprises single-crystal silicon.

In use monitor wafer 100 is first placed in an implantation tool (not shown) and the dopant species X is implanted into a surface region (a region of wafer 100 adjacent to top surface 105). This forms a dopant layer 120 (see FIG. 1B) in a region of substrate 100 adjacent to top surface 105. Examples of dopant species X include, but are not limited to species containing boron, phosphorus, arsenic, germanium, aluminum, and gallium. Then, monitor wafer 100 is annealed in order to thermally activate the implanted dopants using a conventional method such as RTA (rapid thermal anneal). The anneal process is performed in an inert gas and heats monitor wafer to between about 800° C. and about 1300° C. Implantation places dopant species in interstitial positions in the crystal lattice of wafer 100. The dopant in interstitial positions is not electrically active. Annealing moves the implanted species from interstitial positions in the substrate lattice-to-lattice positions where the dopant species is electrically active. Annealing also smoothes out dopant species concentration gradients within the ion implanted region.

Figure 1B:
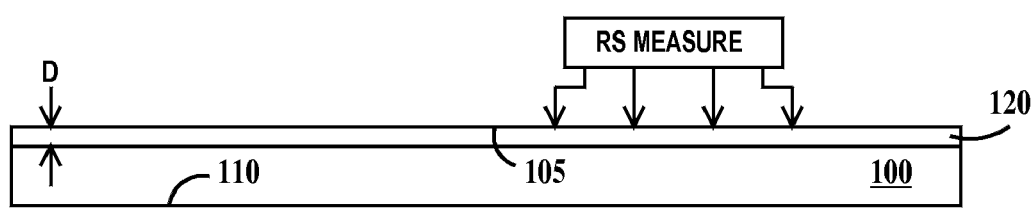
FIG. 1B is a cross-section view of an ion implantation monitor wafer being measured after dopant implantation and thermal activation, in accordance with embodiments of the present invention.

FIG. 1B is a cross-section view of an ion implantation monitor wafer being measured after dopant implantation and thermal activation, in accordance with embodiments of the present invention. In FIG. 1B, dopant layer 120 has a thickness D. One purpose of monitor wafers is to monitor the amount and/or uniformity of the active dopant species dose or concentration. Dose is the number of dopant atoms implanted into each square cm of surface 105 while concentration is the number of dopant atoms per cubic cm of dopant region 120. A common method of measuring ion implant dose/concentration is by a four-point sheet resistance (RS) measurement from which the active dopant dose/concentration can be calculated. As a result, from the determined doping dose/concentration, it can be determined whether the ion implantation process is within a predetermined specification. In order to reuse a monitor wafer, dopant layer 120 is removed.

Figure 2:
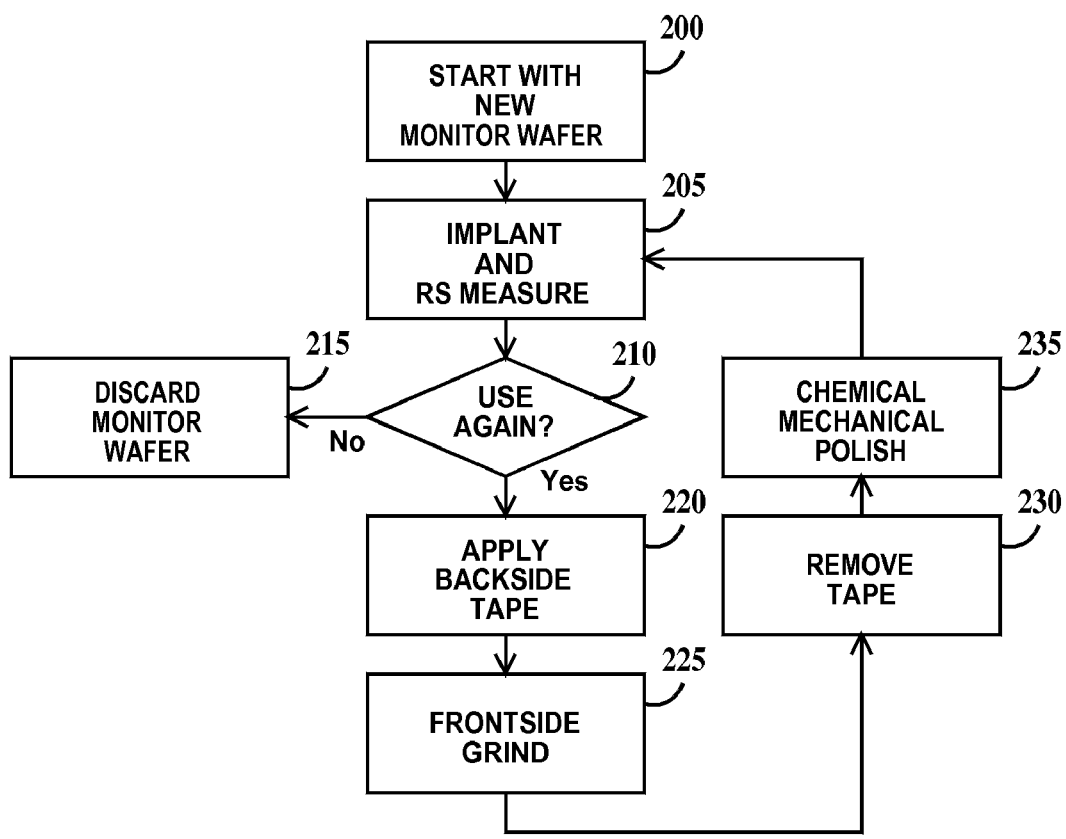
FIG. 2 is a flowchart that illustrates a method for recycling the monitor wafers according to an embodiment of the present invention.

FIG. 2 is a flowchart that illustrates a method for recycling the monitor wafers according to an embodiment of the present invention. In step 200, a new monitor wafer is selected and in step 205 the monitor wafer is implanted, annealed, and measured. In step 210, it is determined if the monitor wafer is to be reused. The decision to reuse or not is based on the thickness of the monitor wafer which can be determined by (i) tracking the number of times the monitor wafer has been used if the recycle process removes a constant amount of material or by (ii) measuring the thickness of the monitor wafer. For example, if a new monitor wafer has an initial thickness of about 725 microns, the recycle process removes about the top 25 microns of the wafer and the thinnest monitor wafer allowed is about 600 microns, then the number of uses is limited to four or five. Note, in this example, D of FIG. 1B would be less than about 20 microns. After four uses the monitor wafer would have a thickness of about 625 microns and after four uses the monitor wafer would have a thickness of about 600 microns. The thickness/number of uses limits is important, because thinner wafers are more easily broken and wafer breakage in semiconductor fabrication tools can be very expensive and time consuming to clean up in addition to the loss of tool productivity.

Figure 3:
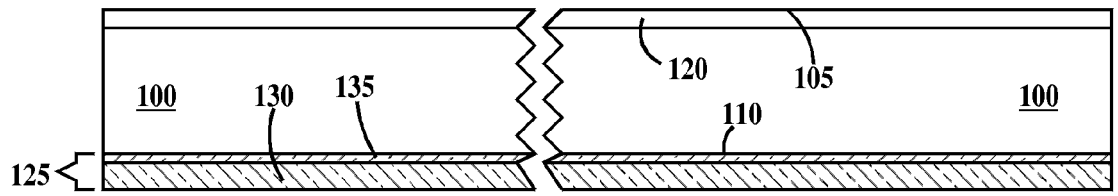
FIG. 3 is a cross-section of the ion implant monitor wafer of FIG. 1B after application of tape according to embodiments of the present invention.

If in step 210, it is decided not to reuse the monitor wafer, in step 215 the monitor wafer is discarded and the method ends, otherwise the method proceeds to step 220. In step 220, an adhesive tape is applied to the bottom surface of the monitor wafer (this the surface that is not implanted). Tape application is described infra and is illustrated in FIG. 3.

Next in step 225, a grinding process is performed to completely remove implanted region 120 (see FIG. 1B). In one example, grinding is a two-step process. In the first step, a first grinding process utilizes a diamond wheel having about 40 microns diamond particles and water to flush away the resultant wafer particles and, starting from the top surface of the monitor wafer, removes about 15 microns of thickness from the monitor wafer. The second grinding process utilizes a diamond wheel having about 5 microns diamond particles and water to flush away the resultant wafer particles and, starting from the top surface of the monitor wafer removes, an additional about 5 microns of thickness from the monitor wafer. After the first and second grinding processes, no dopant layer 120 (see FIG. 1B) remains. Diamond grinding with water is defined as a non-chemical removal processes since silicon is insoluble in water. By contrast, silicon is soluble in an aqueous solution of HF, an aqueous solution of HF and $HNO_3$, and an aqueous solution of KOH, to give a few examples. Thus dopant layer 120 (see FIG. 1B) has been removed without chemical (wet or dry etching) of the implanted layer.

In one example, dopant layer 120 (see FIG. 1B) is completely removed by the first grinding process and the second grinding process (which uses finer diamond particles than the first grinding process) reduces surface roughness induced by the first grinding process. In one example, dopant layer 120 is partially removed by the first grinding process and any remaining dopant layer is completely removed by the second grinding process. In one example, the grinding is a one step process and the second grinding step described supra is omitted so dopant layer 120 is completely removed by this single (first) grinding process. In a single step grinding process the size of the diamond particles may be between the sizes used in the two-step grinding process (i.e., between about 5 and about 40 microns).

The tape cushions the monitor wafer against vibrational shocks during the grinding process and reduces the breakage rate during recycling. In one example, the breakage rate of 200 mm monitor wafers was reduced from several per thousand wafers to none. Additionally, thinner monitor wafers may be used or the monitor wafers may be used more times (then when no tape is used).

In step 230, the tape is removed. Tape removal is discussed infra. Since the grinding process introduces surface roughness that would reduce the accuracy of the ion implantation dose/concentration monitoring, in step 235, a chemical-mechanical-polishing (CMP) process is performed. In one example, the CMP is performed using a slurry of silica in aqueous KOH and removes, starting from the top surface of the monitor wafer, an additional about 1 to about 2 microns of thickness from the monitor wafer.

Optionally, between steps 235 and 205 a cleaning and/or annealing process is performed. In an optional cleaning process, monitor wafer 110 is cleaned using a Huang A solution (i.e., an aqueous solution of ammonium hydroxide and hydrogen peroxide ($NH_4OH/H_2O_2/H_2O$)) and/or a Huang B solution (i.e., an aqueous solution of hydrochloric acid and hydrogen peroxide ($HCl/H_2O_2/H_2O$)). More specifically, the Huang A solution removes organic materials, whereas the Huang B solution removes metallic materials. It should be noted that the Huang A and/or Huang B solutions remove the organic and metallic materials without affecting silicon lattice of monitor wafer 100. Optionally, after cleaning using the Huang A solution and/or the Huang B solution, monitor wafer 100 is annealed using a conventional method such as RTA. The anneal process is performed in an inert gas and heats monitor wafer 100 to between about 800° C. and about 1300° C.

Optionally, between steps 225 and 205 a test for complete removal of dopant layer 120 (see FIG. 1B) can be performed using, for example, a four-point RS measurement. Any monitor wafer that fails this test can be discarded or reground.

FIG. 3 is a cross-section of the ion implant monitor wafer of FIG. 1B after application of tape according to embodiments of the present invention. In FIG. 3, attached to bottom surface 110 of monitor wafer 100 is a tape 125. In one example, tape 125 covers the entire bottom surface 110 of monitor wafer 100. Tape 125 includes a base layer 130 and an adhesive layer 135. Adhesive layer 135 temporally bonds base layer 130 to bottom surface 110 of wafer monitor 100. Dopant layer 120 is still present in FIG. 3, as no grinding has yet been performed. In one example, base layer 130 is a pliable plastic such as polyvinyl chloride (PVC) or ethylene vinyl acetate (EVA).

Examples of two types of tape that may be used are ultraviolet (UV) sensitive tape and pressure sensitive tape. The adhesive layer in both tapes more strongly adheres to the base layer than to the monitor wafer. In a UV sensitive tape, it is the adhesive that is sensitive to UV radiation. UV sensitive tapes will adhere to monitor wafer when pressed on. Exposing a UV sensitive tape to UV radiation reduces the adhesion of the adhesive layer to the monitor wafer to less than before UV exposure so the tape can be more easily peeled off the monitor wafer. Pressure sensitive tapes will adhere to monitor wafer when pressed on, but the adhesive layer is more strongly bonded to the base layer than the monitor layer, so the tape can be peeled off the monitor wafer. An example of a UV sensitive tape is Nitto BP-2650-8 and of a pressure sensitive tape is Nitto BT-150E-KL both manufactured by Nitto Denko Corp (Taiwan).

Figure 4:
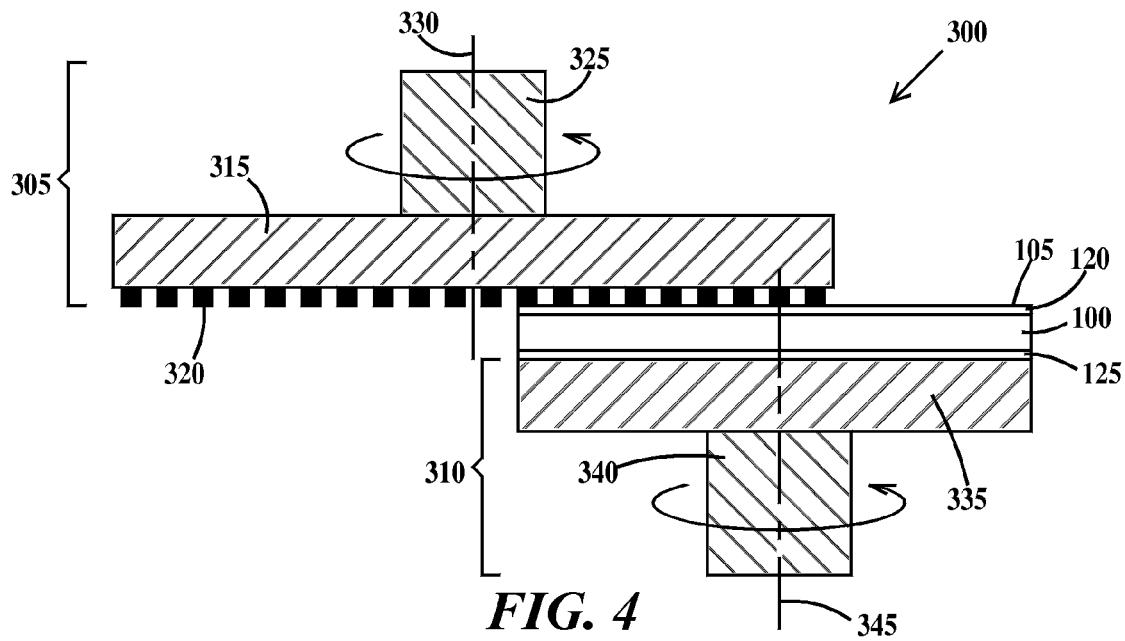
FIG. 4 is a cross-section view of an exemplary wafer-grinding tool, in accordance with embodiments of the present invention.

FIG. 4 is a cross-section view of an exemplary wafer-grinding tool, in accordance with embodiments of the present invention. In FIG. 4, a grinding tool 300 comprises a grinding wheel 305 and a wafer chuck 310. Grinding wheel 305 includes a circular grinding plate 315 having attached and protruding diamond particles 320. Grinding plate 315 is attached to a drive shaft 325. Grinding plate 315 and drive shaft 325 share a common rotational axis 330. Grinding plate 315 can be driven to rotate about axis 330. Wafer chuck 310 includes a wafer holder 335 attached to a drive shaft 340. Wafer holder 335 and drive shaft 340 share a common rotation axis 345. Monitor wafer 100 is temporarily fixed to wafer holder 335 so monitor wafer 100 can be driven to rotate about axis 345. Tape 125 intervenes between monitor wafer 100 and wafer holder 335 and dopant layer 120 contacts diamond particles 320. Axes 330 and 345 are parallel to each other and offset a distance greater than half a diameter of monitor wafer 100.

In operation, drive shafts 325 and 340 are rotated in a same direction while grinding plate 315 and wafer holder 335 are pressed together causing diamond particles 320 into direct physical contact with the top surface of dopant layer 120. As a result, every point on the top surface of the dopant layer 120 comes into contact with the diamond particles 320 resulting in thinning or complete removal of the dopant layer depending upon the specific one or two step grinding processes used as described supra.

Grinding tool 300 can be used for both course grinding and fine grinding by changing the grinding plate 315 from one with course diamond particles (e.g., about 40 microns) to one with fine diamond particles (e.g., about 5 microns). Alternatively, grinding tool 300 can comprise two or more grinding wheels 305, each having a different a grinding plate 315 with different diamond particle sizes. It should be noted that, the material removal rate is higher in using a coarse grinding process than in a fine grinding process.

Figure 5:
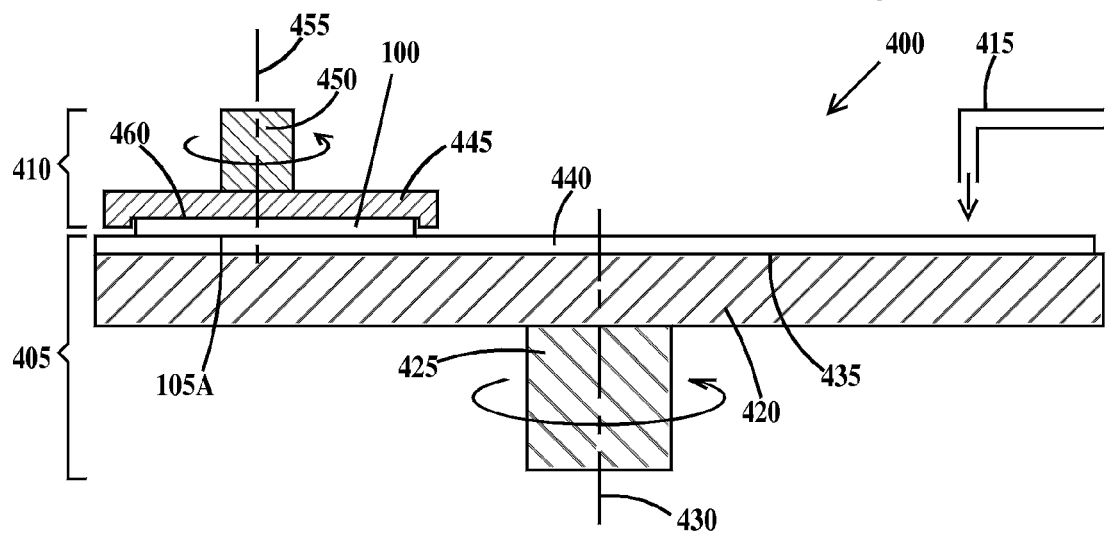
FIG. 5 is a cross-section view of an exemplary chemical-mechanical-polishing apparatus, in accordance with embodiments of the present invention.
Figure 7:
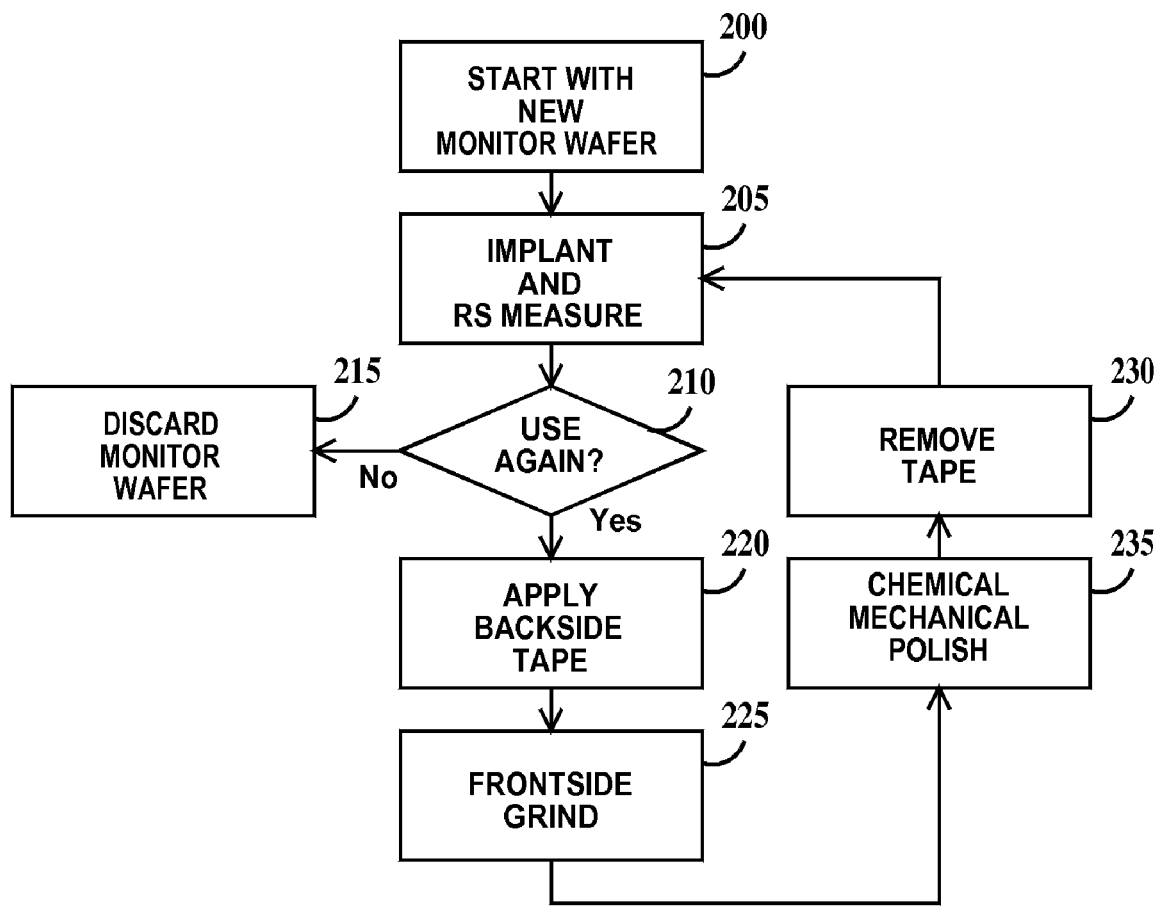
FIG. 7 is a flowchart that illustrates a method for recycling the monitor wafers according to an alternative embodiment of the present invention.

FIG. 5 is a cross-section view of an exemplary chemical-mechanical-polishing apparatus, in accordance with embodiments of the present invention. In FIG. 5, CMP apparatus 400 comprises a polishing wheel 405, a wafer chuck 410 and slurry dispenser 415. Polishing wheel 405 includes a polishing plate 420 attached to a drive shaft 425. Polishing plate 420 and drive shaft 430 share a common rotational axis 430. Fixed to a top surface 435 of polishing wheel 420 is a polishing pad 440. Polishing pad 440 can be driven to rotate about axis 430. Polishing pad 440 is generally a planar pad made from a continuous phase matrix material such as polyurethane. Wafer chuck 410 includes a wafer holder 445 attached to a drive shaft 450. Wafer holder 445 and drive shaft 450 share a common rotational axis 455. Monitor wafer 100 is temporarily fixed to a bottom surface 460 of wafer holder 445 so monitor wafer 100 can be driven to rotate about axis 455. Axes 430 and 455 are parallel to each other and offset a distance greater than a diameter of monitor wafer 100. Either bottom surface 110 of monitor wafer 100 or tape 125 (see FIG. 3) contacts bottom surface 455 of wafer holder 445 depending upon whether the tape is removed before CMP as illustrated in FIG. 2 and described supra or removed after CMP as illustrated in FIG. 7 and described infra.

In operation, drive shafts 430 and 455 are rotated in a same direction while pressure applied to wafer chuck 410 forces a top surface 105A (created by grinding top surface 105 (see FIG. 3) of monitor wafer 100 against polishing pad 440 which is soaked with a slurry dispensed onto the polishing pad by dispenser 415. Illustratively, the slurry contains abrasive particles made of material such as silica and an aqueous base such as KOH. As a result, the top surface 105A of monitor wafer 100 is polished by the motion of the polishing pad 440 and monitor wafer 110, and the abrasive action of the silica and chemical action of the basic solution disposed there between. In one example, the basic solution has a pH value of about ten.

Figure 6A:
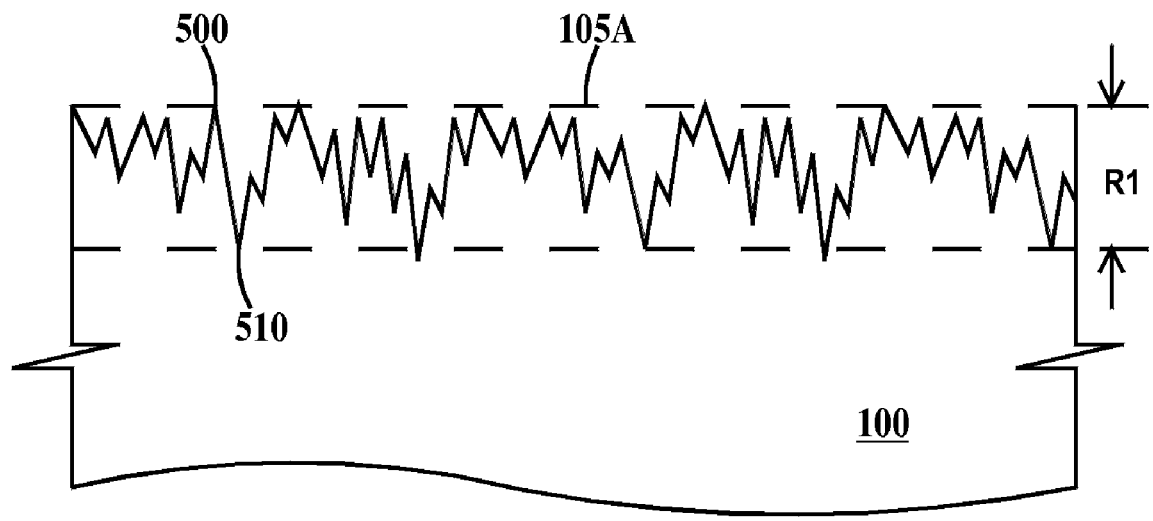
FIG. 6A is a cross-section view of an ion implantation monitor wafer after grinding according to embodiments of the present invention.

FIG. 6A is a cross-section view of an ion implantation monitor wafer after grinding according to embodiments of the present invention. More specifically, after step 225 of FIG. 2 or FIG. 7 is performed, the top surface of monitor wafer 100 has a maximum roughness height (Rmax) equal to R1, wherein R1 is the maximum of all the vertical distances, measured perpendicular to top surface 105A of monitor wafer 100, between adjacent peaks and valleys in the top surface of the monitor wafer 110. In FIG. 6A, R1 is the vertical distance between the two adjacent peak 500 and valley 510. In one example, Rmax is about 77 nanometers. Surface 105A is derived from surface 105 (see FIG. 3) after the grinding process(s) of step 225 of FIG. 2 or FIG. 7 is complete.

Figure 6B:
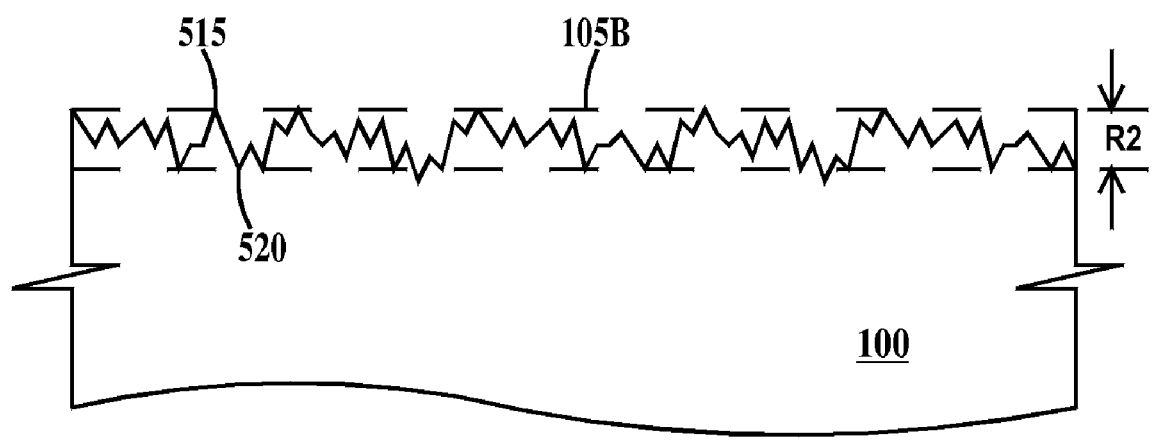
FIG. 6B is a cross-section view of an ion implantation monitor wafer after chemical-mechanical-polishing according to embodiments of the present invention.

FIG. 6B is a cross-section view of an ion implantation monitor wafer after chemical-mechanical-polishing according to embodiments of the present invention. More specifically, after step 235 of FIG. 2 or FIG. 7 is performed, the top surface of monitor wafer 100 has a maximum roughness height (Rmax) equal to R2, wherein R2 is the maximum of all the vertical distances, measured perpendicular to top surface 105B of monitor wafer 100, between adjacent peaks and valleys in the top surface of the monitor wafer 110. In FIG. 6B, R2 is the vertical distance between the two adjacent peak 515 and valley 530. In one example, Rmax is about 8.7 nanometers. In one example, Rmax does not exceed about 20 nanometers. Surface 105B is derived from surface 105A (see FIG. 6A) after the CMP process of step 235 of FIG. 2 or FIG. 7 is complete. Thus the CMP process has smoothed the surface created by the grinding. As mentioned supra, the top surface of the monitor wafer needs to be relatively smooth before the monitor wafer can be reused for monitoring the dopant implantation process.

FIG. 7 is a flowchart that illustrates a method for recycling the monitor wafers according to an alternative embodiment of the present invention. FIG. 7 is the same as FIG. 2 except the order of steps 230 and 235 has been reversed. In FIG. 7, the tape is not removed until after CMP step, while in FIG. 2, the tape was removed prior to the CMP step.

Thus the present invention provides a method of recycling monitor wafers includes removing previously implanted layers without chemical (wet or dry etching) of the implanted layer.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the embodiments of the present invention may be practiced on semiconductor substrates having non-circular shapes such as thin and flat polygons. Therefore, it is intended that the following claims cover all such modifications and changes as fall within the true spirit and scope of the invention.

What is claimed is:

1. A method, comprising:

(a) ion implanting a dopant species into a semiconductor wafer to form a dopant layer in said semiconductor wafer, said dopant layer extending from a top surface of said wafer into said wafer a distance less than a thickness of said wafer;

after (a), (b) attaching an adhesive tape to a bottom surface of said wafer, said adhesive tape comprising an adhesive layer on a base layer, said adhesive bonding said base layer to said bottom surface of said wafer, said adhesive layer bonded more strongly to said base layer than to said bottom surface of said wafer;

after (b), (c) removing said dopant layer; and after (c), (d) removing said adhesive tape.

2. The method of claim 1, wherein no chemical etching is performed on said dopant layer during said removing of said dopant layer.

3. The method of claim 1, wherein said (c) includes:

grinding said top surface of said wafer until said dopant layer is completely removed to form a new top surface; and said method further including:

after (d), (e) performing a chemical-mechanical-polishing of said new top surface of said wafer.

4. The method of claim 1, wherein said (c) includes:

(i) grinding said top surface of said wafer with a wheel having a first particle size until said dopant layer is completely removed to form a first new top surface and (ii) grinding said first new top surface of said wafer with a wheel having a second particle size less than said first particle size to form a second new top surface; and said method further including:

after (d), (e) performing a chemical-mechanical-polishing of said second new top surface of said wafer.

5. The method of claim 1, wherein (c) includes:

(i) grinding said top surface of said wafer with a wheel having a first particle size to remove less than a whole portion of said dopant layer to form a first new top surface and (ii) grinding said first new top surface of said wafer with a wheel having a second particle size less than said first particle size to remove any remaining portion of said dopant layer to form a second new top surface; and said method further including:

after (d), (e) performing a chemical-mechanical-polishing of said second new top surface of said wafer.

6. The method of claim 1, wherein said (c) includes:

grinding said top surface of said wafer until said dopant layer is completely removed to form a new top surface; and said method further including:

after (c) and before (d), performing a chemical-mechanical-polishing of said new top surface of said wafer.

7. The method of claim 1, wherein said (c) includes:

(i) grinding said top surface of said wafer with a wheel having a first particle size until said dopant layer is completely removed to form a first new top surface and (ii) grinding said first new top surface of said wafer with a wheel having a second particle size less than said first particle size to form a second new top surface; and said method further including:

after (c) and before (d), performing a chemical-mechanical-polishing of said second new top surface of said wafer.

8. The method of claim 1, wherein said (c) includes:

(i) grinding said top surface of said wafer with a wheel having a first particle size to remove less than a whole portion of said dopant layer to form a first new top surface and (ii) grinding said first new top surface of said wafer with a wheel having a second particle size less than said first particle size to remove any remaining portion of said dopant layer to form a second new top surface; and said method further including:

after (c) and before (d), performing a chemical-mechanical-polishing of said second new top surface of said wafer.

9. The method of claim 1, wherein said adhesive layer is pressure sensitive and said base layer comprises a pliable plastic.

10. The method of claim 1, wherein said adhesive tape covers the entire bottom surface of said wafer.

11. The method of claim 1, wherein (d) includes exposing said adhesive tape to ultraviolet light.

12. The method of claim 1, wherein after (c) a maximum roughness height of said wafer does not exceed about 20 nanometers, said maximum roughness height defined as the maximum of all the vertical distances, measured perpendicular to said top surface of wafer, between adjacent peaks and valleys in said top surface of said wafer.

13. A method, comprising:

(a) providing a semiconductor wafer;

(b) ion implanting a dopant species into said wafer to form a dopant layer in said wafer, said dopant layer extending from a top surface of said wafer into said wafer a distance less than a thickness of said wafer;

after (b), (c) attaching an adhesive tape to a bottom surface of said wafer, said adhesive tape comprising an adhesive layer on a base layer, said adhesive bonding said base layer to said bottom surface of said wafer, said adhesive layer bonded more strongly to said base layer than to said bottom surface of said wafer;

after (c), (d) removing said dopant layer; and after (d), (e) removing said adhesive tape; and after (e), (f) repeating steps (b) through (e) on said wafer a predetermined number of times.

14. The method of claim 13, wherein no chemical etching is performed on said dopant layer during said removing of said dopant layer.

15. The method of claim 13, wherein (d) includes:

grinding said top surface of said wafer until said dopant layer is completely removed to form a new top surface; and said method further including:

after (e) and before (f), performing a chemical-mechanical-polishing of said new top surface of said wafer.

16. The method of claim 13, wherein said (d) includes:

(i) grinding said top surface of said wafer with a wheel having a first particle size until said dopant layer is completely removed to form a first new top surface and (ii) grinding said first new top surface of said wafer with a wheel having a second particle size less than said first particle size to form a second new top surface; and said method further including:

after (e) and before (f), performing a chemical-mechanical-polishing of said second new top surface of said wafer.

17. The method of claim 13, wherein said (d) includes:

(i) grinding said top surface of said wafer with a wheel having a first particle size to remove less than a whole portion of said dopant layer to form a first new top surface and (ii) grinding said first new top surface of said wafer with a wheel having a second particle size less than said first particle size to remove any remaining portion of said dopant layer to form a second new top surface; and said method further including:

after (e) and before (f), performing a chemical-mechanical-polishing of said second new top surface of said wafer.

18. The method of claim 13, wherein said (d) includes:

grinding said top surface of said wafer until said dopant layer is completely removed to form a new top surface; and said method further including:

after (d) and before (e), performing a chemical-mechanical-polishing of said new top surface of said wafer.

19. The method of claim 13, wherein said (d) includes:

(i) grinding said top surface of said wafer with a wheel having a first particle size until said dopant layer is completely removed to form a first new top surface and (ii) grinding said first new top surface of said wafer with a wheel having a second particle size less than said first particle size to form a second new top surface; and said method further including:

after (d) and before (e), performing a chemical-mechanical-polishing of said second new top surface of said wafer.

20. The method of claim 13, wherein said (d) includes:

(i) grinding said top surface of said wafer with a wheel having a first particle size to remove less than a whole portion of said dopant layer to form a first new top surface and (ii) grinding said first new top surface of said wafer with a wheel having a second particle size less than said first particle size to remove any remaining portion of said dopant layer to form a second new top surface; and said method further including:

after (d) and before (e), performing a chemical-mechanical-polishing of said second new top surface of said wafer.

21. The method of claim 13, wherein (b) includes:

heating said wafer to a temperature greater than room temperature, said heating activating said dopant species.

22. The method of claim 21, further including:

after said heating, measuring an amount of dopant in said dopant layer.

23. The method of claim 21, wherein said measuring said amount of dopant includes measuring a sheet resistance of said dopant layer.

24. The method of claim 13, further including:

after (e) and before (f), cleaning said wafer in an aqueous solution of ammonium hydroxide and hydrogen peroxide, (ii) cleaning said wafer in an aqueous solution of hydrochloric acid and hydrogen peroxide, or (iii) cleaning said wafer in said of aqueous solution of ammonium hydroxide and hydrogen peroxide followed by cleaning said wafer in said aqueous of solution hydrochloric acid and hydrogen peroxide.

25. The method of claim 13, wherein said wafer comprises single-crystal silicon.

* * * * *